US010475794B1

(12) United States Patent
Wu et al.

(10) Patent No.: US 10,475,794 B1
(45) Date of Patent: Nov. 12, 2019

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Po-Han Wu, Pingtung County (TW); Fu-Che Lee, Taichung (TW); Chien-Cheng Tsai, Kaohsiung (TW); Tzu-Tsen Liu, Kaohsiung (TW); Wen-Chieh Lu, Taoyuan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/026,069

(22) Filed: Jul. 3, 2018

(30) Foreign Application Priority Data

Jun. 7, 2018 (CN) .......................... 2018 1 0582040

(51) Int. Cl.
*H01L 27/108* (2006.01)
*H01L 21/762* (2006.01)

(52) U.S. Cl.
CPC ...... *H01L 27/10805* (2013.01); *H01L 21/762* (2013.01); *H01L 27/10885* (2013.01); *H01L 27/10888* (2013.01); *H01L 27/10891* (2013.01)

(58) Field of Classification Search
CPC ......... H01L 27/10805; H01L 27/10888; H01L 27/10891; H01L 27/10885; H01L 21/762
See application file for complete search history.

(56) References Cited

U.S. PATENT DOCUMENTS

2004/0253811 A1* 12/2004 Lee .................... H01L 21/02063
438/633
2011/0260288 A1 10/2011 Sukekawa et al.
2014/0027924 A1* 1/2014 Lee .......................... H01L 21/48
257/774

* cited by examiner

*Primary Examiner* — Karen Kusumakar
(74) *Attorney, Agent, or Firm* — Winston Hsu

(57) ABSTRACT

A method for fabricating semiconductor device includes the steps of: forming a first bit line structure on a substrate; forming a first spacer adjacent to the first bit line structure; forming an interlayer dielectric (ILD) layer adjacent to the first spacer; removing part of the ILD layer and part of the first spacer to expose a sidewall of the first bit line structure; and forming a first storage node contact isolation structure adjacent to the first bit line structure, wherein the first storage node contact isolation structure contacts the first bit line structure and the first spacer directly.

14 Claims, 5 Drawing Sheets

US 10,475,794 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of fabricating fuse structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a first bit line structure on a substrate; forming a first spacer adjacent to the first bit line structure; forming an interlayer dielectric (ILD) layer adjacent to the first spacer; removing part of the ILD layer and part of the first spacer to expose a sidewall of the first bit line structure; and forming a first storage node contact isolation structure adjacent to the first bit line structure, wherein the first storage node contact isolation structure contacts the first bit line structure and the first spacer directly.

According to another aspect of the present invention, a semiconductor device includes: a first bit line structure extending along a first direction on a substrate; a first spacer extending along the first direction adjacent to the first bit line structure; and a first storage node contact isolation structure extending along a second direction adjacent to the first bit line structure, wherein the first storage node contact contacts the first bit line structure and the first spacer directly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
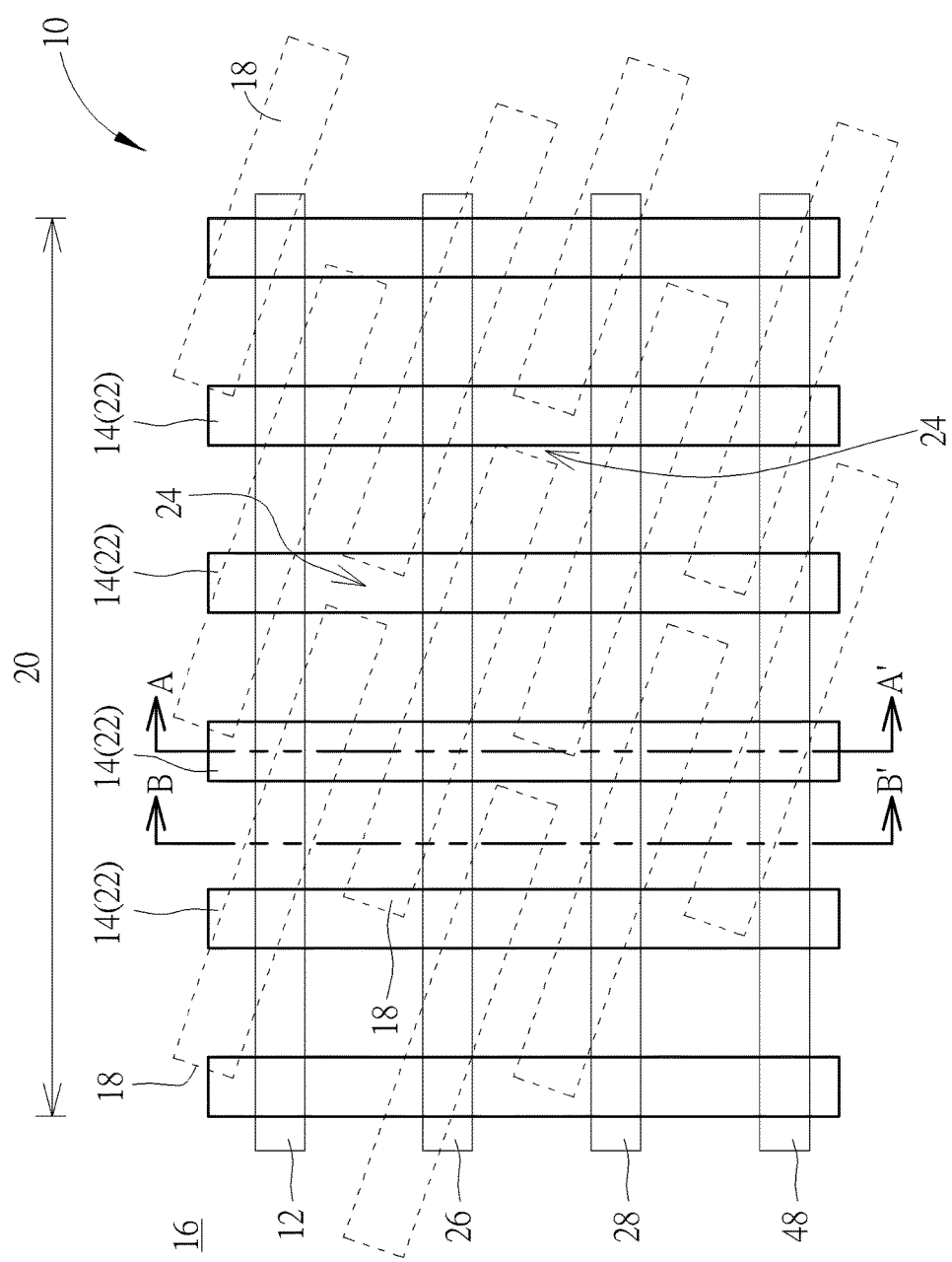
FIG. 1 illustrates a top-view diagram of a DRAM device according to an embodiment of the present invention.
Figure 2:
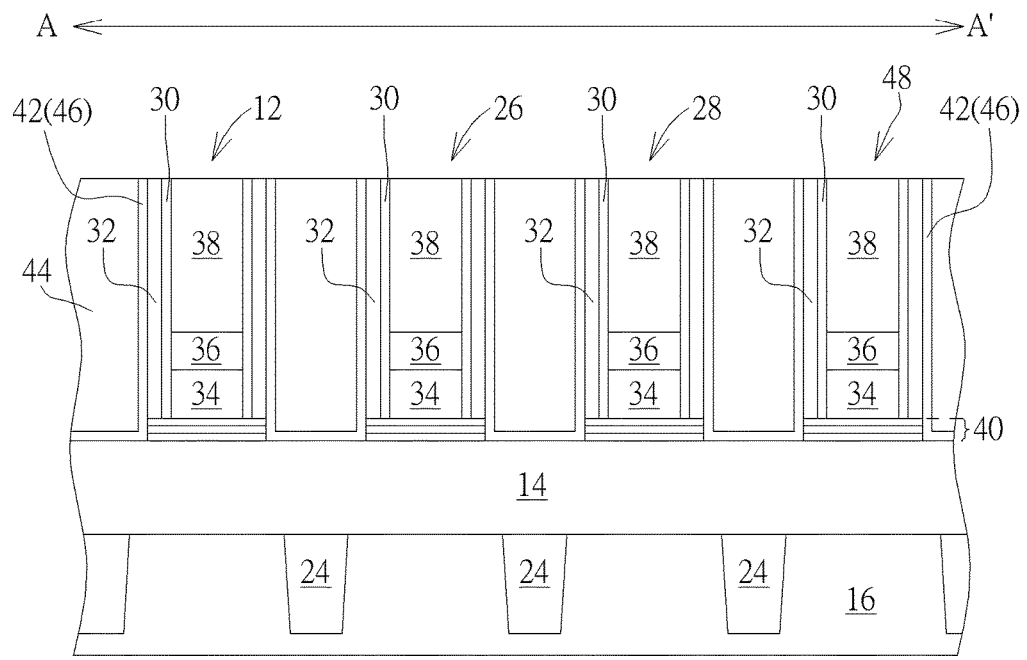
FIGS. 2-4 illustrate cross-section views of a method for fabricating a DRAM device along the sectional line AA' of FIG. 1.
Figure 3:
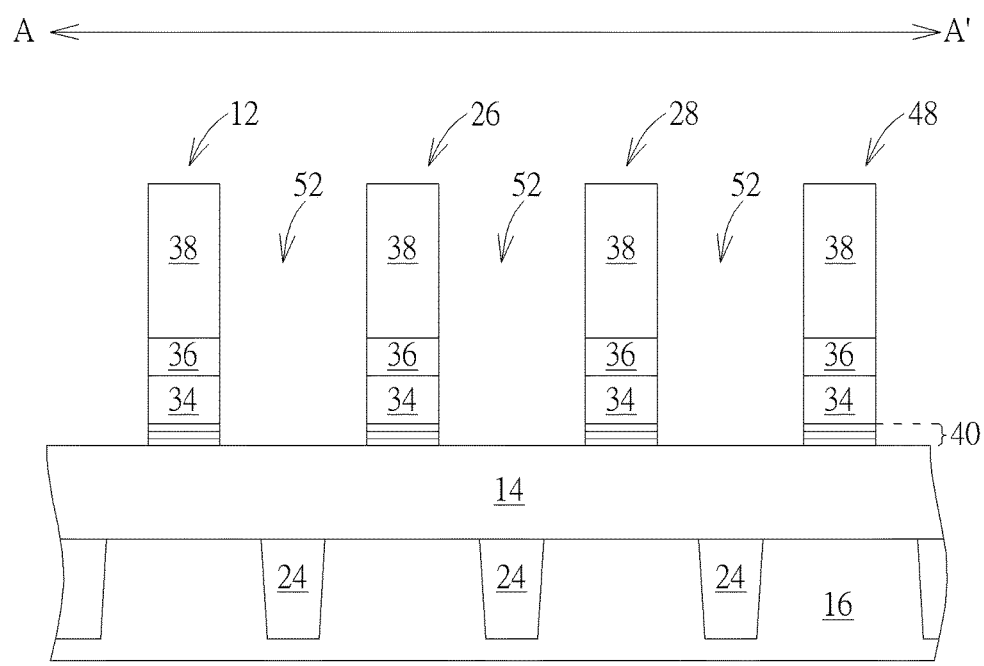
Figure 4:
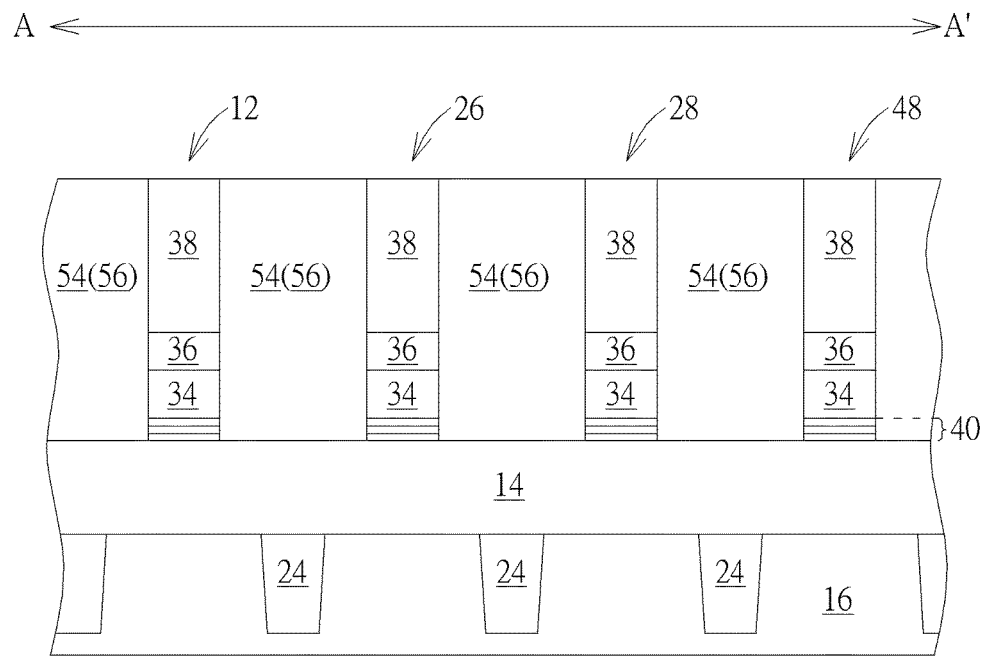
Figure 6:
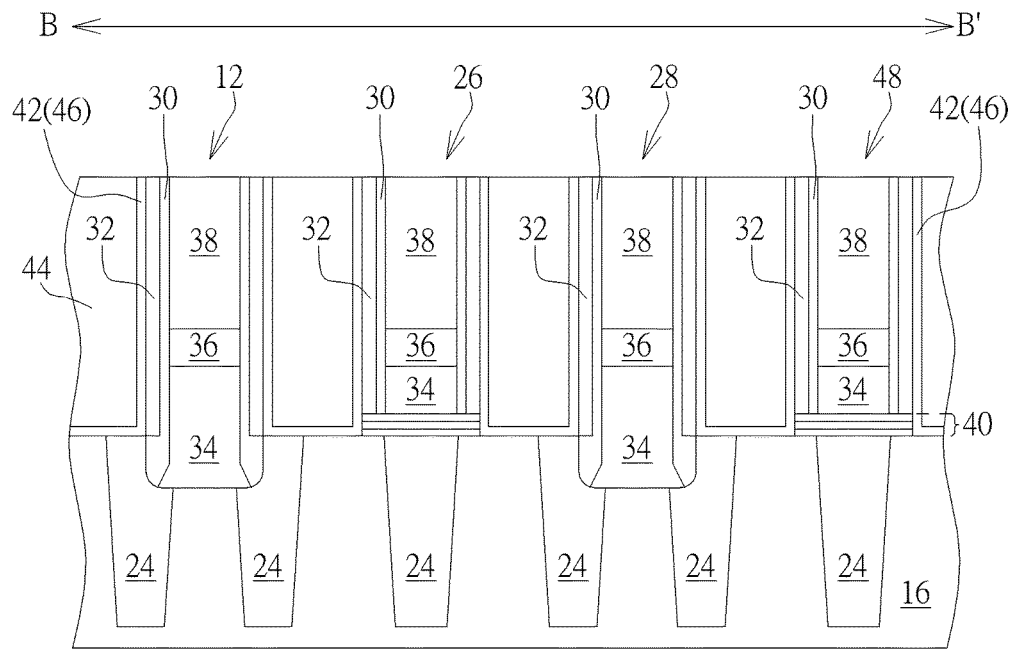
Figure 7:
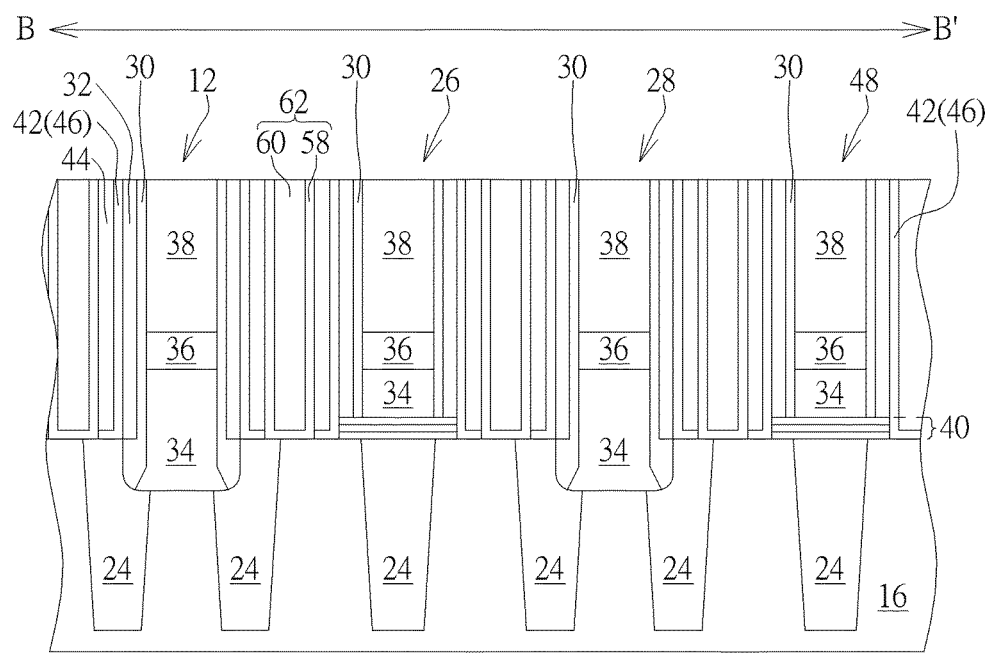
Figure 8:
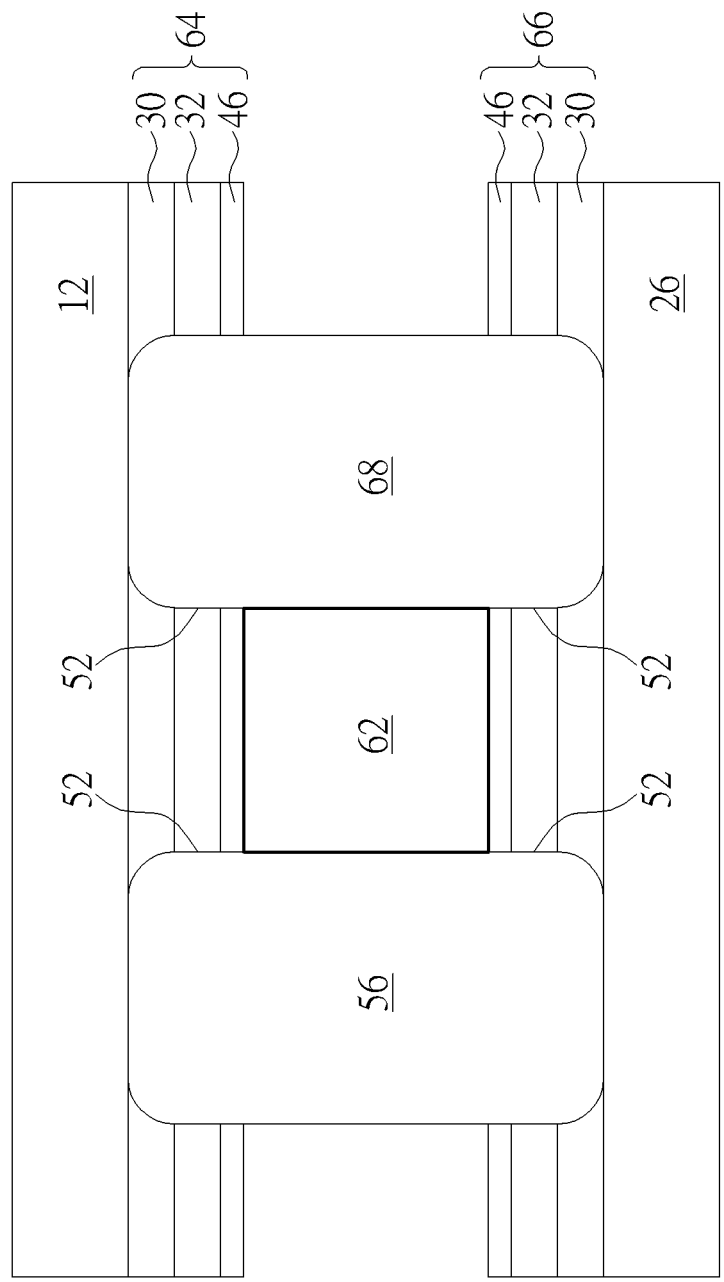
FIG. 8 illustrates an enlarged top view of two adjacent bit line structures shown in FIG. 1.

Referring to FIGS. 1-8, FIGS. 1-8 illustrate a method for fabricating a DRAM device according to an embodiment of the present invention, in which FIG. 1 illustrates a top-view diagram of a DRAM device, FIGS. 2-4 illustrate cross-section views of a method for fabricating a DRAM device along the sectional line AA' of FIG. 1, FIGS. 5-7 illustrate cross-section views of a method for fabricating a DRAM device along the sectional line BB' of FIG. 1, and FIG. 8 illustrates an enlarged top view of two adjacent bit line structures shown in FIG. 1.

Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12, 26, 28, 48 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12, 26, 28, 48 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 5:
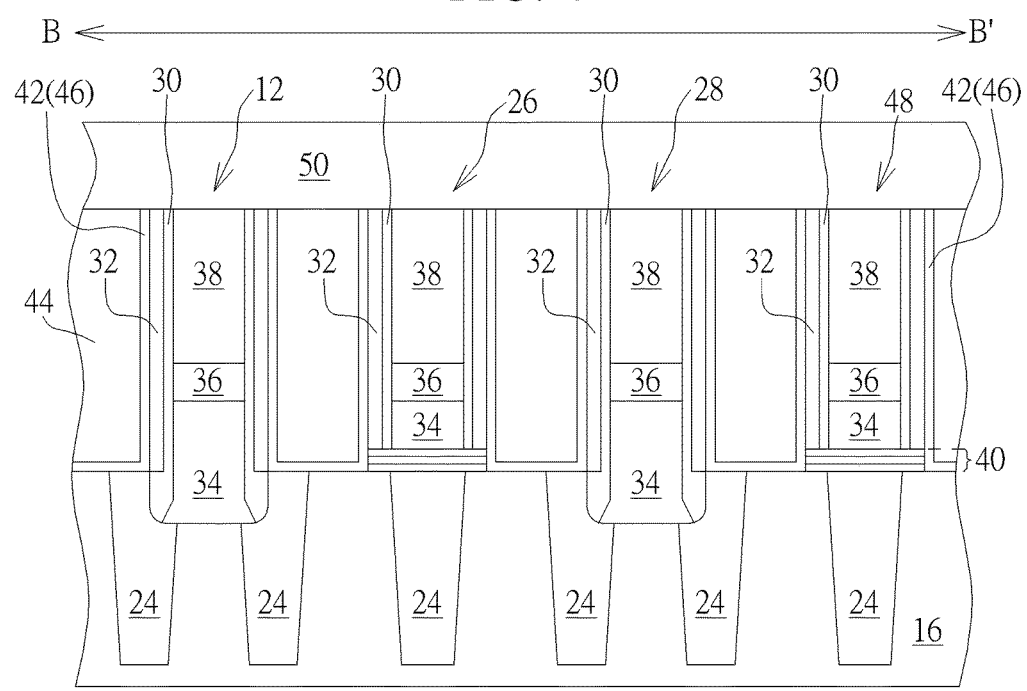
FIGS. 5-7 illustrate cross-section views of a method for fabricating a DRAM device along the sectional line BB' of FIG. 1.

The fabrication process conducted after the formation of word lines 14 (or also referred to as buried word lines) is explained below. First as shown in FIGS. 2 and 5, the aforementioned bit lines or bit line structures 12, 26, 28, 48 are formed on the memory region 20 and gate structures (not shown) are formed on the periphery region. In this embodiment, elements including word lines 14, STI 24, and active region 18 could be formed in the substrate 16 under the bit line structures 12, 26, 28, 48 and a first spacer 30 and a second spacer 32 could be formed adjacent to two sides of each of the bit line structures 12, 26, 28, 48. Preferably, the bit line structures 12, 28 shown in FIG. 5 could include a non-metal conductive layer 34, a selective barrier layer (not shown), a metal layer 36, and a mask layer 38 and the bit line structures 26, 48 could include a stacked layer 40 made of oxide-nitride-oxide (ONO), a non-metal conductive layer 34, a selective barrier layer (not shown), a metal layer 36, and a mask layer 38. Preferably, the non-metal conductive layer 34 could include polysilicon, amorphous silicon, other silicon-containing or non-silicon containing non-metal conductive material, the barrier layer could include Ti, WSi, WN, or other suitable barrier material, the metal layer 36 could include Al, W, Cu, TiAl alloy, or other low resistance metal conductive material, and the mask layer 38 could include SiN, SiON, SiCN, or other insulating material.

Next, a liner 42 and an interlayer dielectric (ILD) layer 44 are sequentially formed on the bit line structures 12, 26, 28, 48, the substrate 16, and the STI 24 on the memory region 20 and the gate structure on the periphery region, in which the liner 42 disposed on the periphery region could be used as a contact etch stop layer (CESL) while the liner 42 disposed on the memory region 20 is serving as a third spacer 46 on sidewalls of the second spacers 32. In this embodiment, the first spacers 30 and the third spacers 46 are preferably made of same material while the second spacers 32 and the first spacers 30 (or the third spacers 46) are made of different materials. For instance, the first spacers 30 and the third spacers 46 in this embodiment are preferably made of silicon carbon nitride (SiCN) while the second spacers 32 are made of silicon oxide. Nevertheless, according to other embodiments of the present invention, the first spacers 30 and the third spacers 46 could be made of first dielectric material and the second spacers 32 are made of second dielectric material while both the first dielectric material and the second dielectric material could be selected from the group consisting of $SiO_2$, SiN, SiON, and SiCN. The ILD layer 44 is preferably made of oxides such as tetraethyl orthosilicate (TEOS), but not limited thereto.

Next, a planarizing process such as chemical mechanical polishing (CMP) process is conducted to remove part of the liner 42 and part of the ILD layer 42, and a patterned mask 50 is formed on part of the bit line structures 12, 26, 28, 48. It should be noted that the patterned mask 50 formed at this stage is extending along the Y-direction (such as the direction along the sectional line BB" in FIG. 1) to cover the space between two adjacent word lines 14, hence a patterned mask 50 is disposed on the bit line structures 12, 26, 28, 48 along the sectional line BB' in FIG. 5 while the tops of the bit line structures 12, 26, 28, 48 and the ILD layer 44 along the sectional line AA' shown in FIG. 2 are exposed and no patterned mask 50 is formed atop.

Next, as shown in FIGS. 3 and 6, one or more etching process is conducted by using the patterned mask 50 to remove part of the spacers and expose sidewalls of the bit line structures 12, 26, 28, 48, and the patterned mask 50 is removed thereafter. Specifically, the etching process conducted at this stage preferably removes all of the ILD layer 44 and spacers including the first spacers 30, the second spacers 32, and the third spacers 46 between the bit line structures 12, 26, 28, 48 along the sectional line AA' to form openings 52 between bit line structures 12, 26, 28, 48 and expose sidewalls of the bit line structures 12, 26, 28, 48. Since the top surface of the bit line structures 12, 26, 28, 48 along the sectional line BB' is covered by the patterned mask 50 during the etching process, the first spacers 30, the second spacers 32, the third spacers 46, and the ILD layer 44 would still remain on the sidewalls of the bit line structures 12, 26, 28, 48 after the etching process is completed. In this embodiment, etchant used in the etching process is selected from the group consisting of $C_4F_6$ and $CHF_3$, but not limited thereto.

Next, as shown in FIG. 4, a dielectric layer 54 is formed to fill the openings 52 between bit line structures 12, 26, 28, 48, and a planarizing process such as CMP is conducted to remove part of the dielectric layer 54 so that the top surface of the remaining dielectric layer 54 is even with the top surface of the bit line structures 12, 26, 28, 48. This formed storage node contact isolation structures 56 between bit line structures 12, 26, 28, 48, in which the storage node contact isolation structures 56 in this embodiment is preferably made of dielectric material including but not limited to for example silicon carbon nitride (SiCN).

Next, as shown in FIG. 7, a photo-etching process is conducted to remove part of the ILD layer 44 and part of the third spacers 46 between bit line structures 12, 26, 28, 48 along the sectional line BB' to form contact holes (not shown). Next, a barrier layer 58 and a conductive layer 60 are formed in the contact holes and a planarizing process such as CMP or another etching process is conducted to remove part of the conductive layer 60 and part of the barrier layer 58 to form storage node contacts 62. In this embodiment, the barrier layer 58 could include titanium nitride (TiN), tantalum nitride (TaN), or combination thereof and the conductive layer 60 could include Al, Cr, Cu, Ta, Mo, W, or combination thereof. This completes the fabrication of a DRAM device according to an embodiment of the present invention.

Referring to FIG. 8, FIG. 8 illustrates an enlarged top view of a portion between two adjacent bit line structures 12, 26. As shown in FIG. 8, the semiconductor device preferably includes two adjacent bit line structures such as bit line structure 12 and bit line structure 26 extending along a first direction (such as X-direction) on the substrate 16, spacer 64 including the aforementioned first spacer 30, second spacer 32, and third spacer 46 extending along the same first direction adjacent to the bit line structure 12, spacer 66 including the aforementioned first spacer 30, second spacer 32, and third spacer 46 extending along the first direction adjacent to the bit line structure 26, storage node contact isolation structure 56 and storage node contact isolation structure 68 extending along a second direction (such as Y-direction) between the bit line structure 12 and the bit line structure 26, and a storage node contact 62 disposed between the storage node contact isolation structure 56 and storage node contact isolation structure 68. It should be noted that the spacers 64, 66 are preferably formed on two sides of the bit lines 12, 26 respectively, however for simplicity purpose, the spacers 64, 66 are only shown on one side of each of the bit lines 12, 26 in FIG. 8.

Preferably, the storage node contact isolation structure 56 contacts the bit line structure 12, the spacer 64 on sidewalls of the bit line structure 12, the bit line structure 26, the spacer 66 on sidewalls of the bit line structure 26, and the storage node contacts 62 directly. Similarly, the storage node contact isolation structure 68 contacts the bit line structure 12, the spacer 64 on sidewalls of the bit line structure 12, the bit line structure 26, the spacers 66 on sidewalls of the bit line structure 26, and the storage node contact 62 directly. The storage node contact 62 disposed in the middle on the other hand contacts the spacer 64 on sidewalls of the bit line structure 12, the spacer 66 on sidewalls of the bit line structure 26, the storage node contact isolation structure 56, and the storage node contact isolation structure 68. Viewing from another perspective, each of the spacers 64, 66 includes the opening 52 shown in FIG. 3, in which the openings 52 expose the sidewalls of part of the bit line structures 12, 26 and the storage node contact isolation structures 56, 68 are extended pro protruded into the spacers 64, 66 through the openings 52 to contact the bit line structures 12, 26 directly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first bit line structure on a substrate;
    forming a first spacer adjacent to the first bit line structure;
    forming an interlayer dielectric (ILD) layer adjacent to the first spacer;
    removing part of the ILD layer and part of the first spacer to expose a sidewall of the first bit line structure; and
    forming a first storage node contact isolation structure adjacent to the first bit line structure, wherein the first storage node contact isolation structure contacts the first bit line structure and the first spacer directly.

2. The method of claim 1, further comprising:
    forming the first bit line structure and a second bit line structure on the substrate;
    forming the first spacer adjacent to the first bit line structure and a second spacer adjacent to the second bit line structure;
    forming the ILD layer between the first spacer and the second spacer;
    removing part of the ILD layer, part of the first spacer, and part of the second spacer to expose a sidewall of the first bit line structure and a sidewall of the second bit line structure; and
    forming the first storage node contact isolation structure between the first bit line structure and the second bit line structure, wherein the first storage node contact isolation structure contacts the first bit line structure, the first spacer, the second bit line structure and the second spacer directly.

3. The method of claim 2, further comprising forming the first storage node contact isolation structure and a second storage node contact isolation structure between the first bit line structure and the second bit line structure.

4. The method of claim 3, wherein the second storage node contact isolation structure contacts the first bit line structure, the first spacer, the second bit line structure and the second spacer directly.

5. The method of claim 3, further comprising forming a storage node contact between the first storage node contact isolation structure and the second storage node contact isolation structure.

6. The method of claim 5, wherein the storage node contact contacts the first spacer, the second spacer, the first storage node contact isolation structure, and the second storage node contact isolation structure directly.

7. The method of claim 1, wherein the first storage node contact isolation structure comprises silicon carbon nitride (SiCN).

8. A semiconductor device, comprising:
    a first bit line structure extending along a first direction on a substrate;
    a first spacer extending along the first direction adjacent to the first bit line structure; and
    a first storage node contact isolation structure extending along a second direction adjacent to the first bit line structure, wherein the first storage node contact isolation structure contacts the first bit line structure and the first spacer directly.

9. The semiconductor device of claim 8, further comprising:
    a second bit line structure extending along the first direction on the substrate;
    a second spacer extending along the first direction adjacent to the second bit line structure; and
    the first storage node contact isolation structure between the first bit line structure and the second bit line structure, wherein the first storage node contact isolation structure contacts the first bit line structure, the first spacer, the second bit line structure, and the second spacer directly.

10. The semiconductor device of claim 9, further comprising a second storage node contact isolation structure between the first bit line structure and the second bit line structure.

11. The semiconductor device of claim 10, wherein the second storage node contact isolation structure contacts the first bit line structure, the first spacer, the second bit line structure and the second spacer directly.

12. The semiconductor device of claim 10, further comprising a storage node contact between the first storage node contact isolation structure and the second storage node contact isolation structure.

13. The semiconductor device of claim 12, wherein the storage node contact contacts the first spacer, the second spacer, the first storage node contact isolation structure, and the second storage node contact isolation structure directly.

14. The semiconductor device of claim 8, wherein the first storage node contact isolation structure comprises silicon carbon nitride (SiCN).

* * * * *